US010483499B2

United States Patent
Wang et al.

(10) Patent No.: US 10,483,499 B2
(45) Date of Patent: Nov. 19, 2019

(54) DEFECT REPAIRING METHOD OF FLEXIBLE DISPLAY PANEL

(71) Applicant: Wuhan China Star Optoelectronics Semiconductor Display Technology Co., Ltd., Wuhan, Hubei (CN)

(72) Inventors: Wei Wang, Guangdong (CN); Xiaoguang Zhu, Guangdong (CN)

(73) Assignee: WUHAN CHINA STAR OPTOELECTRONICS SEMICONDUCTOR DISPLAY TECHNOLOGY CO., LTD., Wuhan (CN)

(*) Notice: Subject to any disclaimer, the term of this patent is extended or adjusted under 35 U.S.C. 154(b) by 0 days.

(21) Appl. No.: 15/968,279

(22) Filed: May 1, 2018

(65) Prior Publication Data

US 2019/0140217 A1 May 9, 2019

Related U.S. Application Data

(63) Continuation of application No. PCT/CN2018/074835, filed on Jan. 31, 2018.

(30) Foreign Application Priority Data

Nov. 9, 2017 (CN) .......................... 2017 1 1113366

(51) Int. Cl.
*H01L 21/00* (2006.01)
*H01L 51/56* (2006.01)
(Continued)

(52) U.S. Cl.
CPC ............ *H01L 51/56* (2013.01); *H01L 51/003* (2013.01); *H01L 51/0097* (2013.01);
(Continued)

(58) Field of Classification Search
CPC ... H01L 51/56; H01L 27/3244; H01L 51/003; H01L 51/0097; H01L 51/5253
See application file for complete search history.

(56) References Cited

U.S. PATENT DOCUMENTS 5,620,905 A * 4/1997 Konuma ........... H01L 21/28079
438/163
2017/0047534 A1 2/2017 Yoon et al.

FOREIGN PATENT DOCUMENTS

| CN | 103715136 A | 4/2014 |
| CN | 104091535 A | 10/2014 |

OTHER PUBLICATIONS

Office Action in CN Application No. 201711113366.X, dated Dec. 26, 2018, 7pp.

* cited by examiner

*Primary Examiner* — Richard A Booth
(74) *Attorney, Agent, or Firm* — Hemisphere Law, PLLC; Zhigang Ma

(57) ABSTRACT

The present disclosure provides a defect repairing method of a flexible display panel including: providing a transparent substrate, the transparent substrate including a first surface and a second surface opposite to each other; forming a flexible substrate on the first surface; forming an array substrate layer on the surface of the flexible substrate, wherein the array substrate layer includes a display area and a peripheral area; irradiating the display area with a patterned laser on the second surface; and annealing the transparent substrate on which the array substrate layer and the flexible substrate are formed. The defect repairing method of the flexible display panel can quickly and easily repair various defects caused by the laser irradiation of the flexible (Continued)

display panel so as to optimize the display effect of the flexible display panel and improve the yield of the flexible display panel.

8 Claims, 3 Drawing Sheets

(51) Int. Cl.
*H01L 51/00* (2006.01)
*H01L 51/52* (2006.01)
*H01L 27/32* (2006.01)

(52) U.S. Cl.
CPC ...... *H01L 51/5253* (2013.01); *H01L 27/3244* (2013.01); *H01L 2227/326* (2013.01); *H01L 2251/5338* (2013.01); *H01L 2251/568* (2013.01)

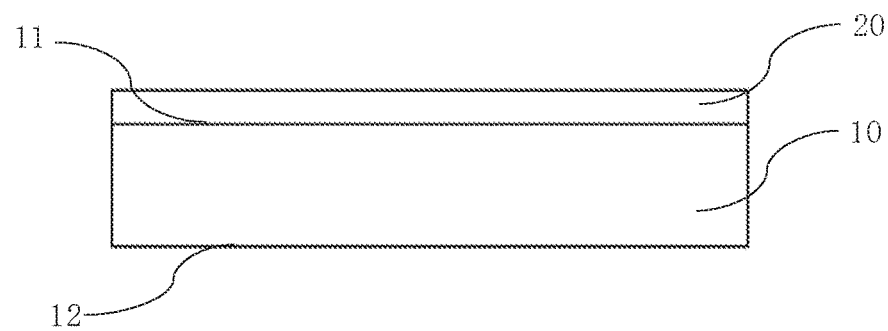
FIG. 3
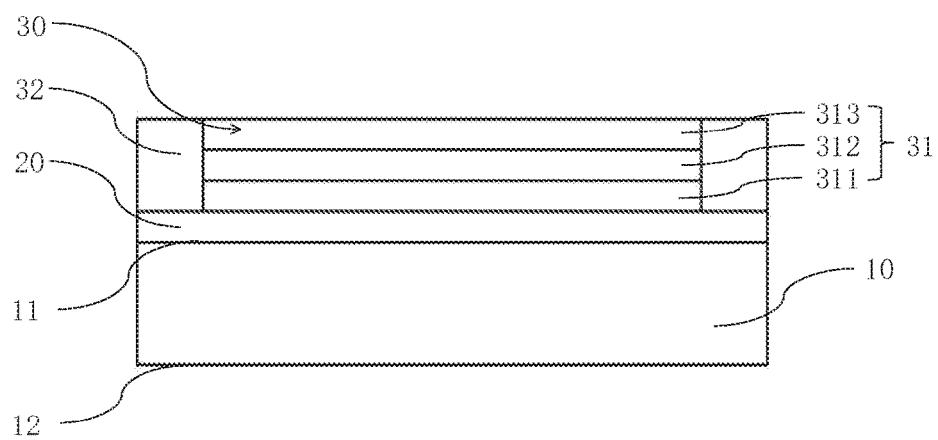
FIG. 4
| Sequentially forming the organic light-emitting layer and the encapsulation layer on the surface of the array substrate layer to form a flexible display panel | S60 |
| Separating the transparent substrate and the flexible substrate located in the peripheral area | S70 |
FIG. 5

DEFECT REPAIRING METHOD OF FLEXIBLE DISPLAY PANEL

RELATED APPLICATIONS

This application is a continuation application of PCT Patent Application No. PCT/CN2018/074835, filed Jan. 31, 2018, which claims the priority benefit of Chinese Patent Application No. CN 201711113366.X, filed Nov. 9, 2017, which is herein incorporated by reference in its entirety.

FIELD OF THE DISCLOSURE

The present disclosure relates to a flexible display technology field, and more particularly to a defect repairing method of a flexible display panel.

BACKGROUND OF THE DISCLOSURE

Flexible display with light weight, small size, curl and impact resistance and many other advantages more and more by the user's attention. Therefore, flexible display technology has gradually been widely developed. In flexible displays, flexible display panels generally use a high temperature plastic substrate. In the manufacturing process of a flexible display panel, a flexible display panel is formed by first forming a flexible substrate by coating and curing on a glass substrate and then forming an electrical control element and a light-emitting pixel unit on the flexible substrate. Finally, the fabricated flexible display panel is separated from the glass substrate to form a flexible and foldable display device.

At present, the separation of the flexible display panel from the glass substrate mainly depends on the laser separation technology. Laser separation technology is a commonly used module process in the flexible display panel manufacturing process. It is the use of high-energy ultraviolet laser to separate the flexible display panel from the glass substrate. However, laser irradiation easily causes many defects on the flexible display panel. This will seriously affect the display of the flexible display panel.

SUMMARY OF THE DISCLOSURE

An object of the present disclosure is to provide a defect repairing method of a flexible display panel, which can quickly and easily repair defects caused by laser in a flexible display panel so as to optimize the display effect of the flexible display panel and improve the yield of the flexible display panel.

A defect repairing method of a flexible display panel, including: providing a transparent substrate, the transparent substrate including a first surface and a second surface opposite to each other;
forming a flexible substrate on the first surface;
forming an array substrate layer on the surface of the flexible substrate, wherein the array substrate layer includes a display area and a peripheral area;
irradiating the display area with a pattered laser on the second surface; and
annealing the transparent substrate on which the array substrate layer and the flexible substrate are formed.

The step of annealing the transparent substrate on which the array substrate layer and the flexible substrate are formed includes, providing an annealing device, placing the flexible substrate in the annealing device, presetting a preset temperature and a preset constant temperature time; starting the annealing device to be heated, the annealing device reaching the preset temperature, and annealing the transparent substrate on which the array substrate layer and the flexible substrate are formed at the preset temperature and the preset constant temperature time.

The step of irradiating the display area with a pattered laser on the second surface includes, providing a mask having a pattern and attaching the mask to the second surface and irradiating the mask by an ultraviolet laser; separating the flexible substrate not blocked by the mask from the transparent substrate, and adhering the flexible substrate covered by the mask and the transparent substrate to each other.

The pattern of the mask makes a position on the transparent substrate not obscured by the mask directly opposite to the display area, the position blocked by the mask is directly opposite to the peripheral area.

After the step of annealing the flexible substrate, further including: forming an organic light-emitting layer and an encapsulating layer sequentially on the surface of the array substrate layer to form a flexible display panel; and separating the transparent substrate located in the peripheral area and the flexible substrate.

In the step of separating the transparent substrate and the flexible substrate, the glass substrate and the flexible substrate are separated by a cutting method.

In the step of separating the transparent substrate and the flexible substrate, the glass substrate and the flexible substrate are separated by a laser separation technique.

The step of forming a flexible substrate on the first surface and forming an array substrate layer on the surface of the flexible substrate includes uniformly coating a polymer solution on the first surface to form the flexible substrate.

The annealing device includes a baking cavity and a heater located at one side of the baking cavity, the baking cavity is configured to heat the transparent substrate forming the array substrate layer and the flexible substrate, and the heater is configured to provide a heat source for heating.

The baking cavity is provided with a plurality of drawable brackets, and the brackets are arranged at equal distances from each other.

Thus, in the embodiment of the present disclosure, by forming an array substrate layer on the surface of the flexible substrate and patterning the second surface of the glass substrate by laser irradiation so that the portion of the flexible substrate irradiated with the laser is separated from the transparent substrate, and the portion of the flexible substrate not irradiated with the laser is closely adhered to the transparent substrate. The flexible substrate is further heated and baked through an annealing device so that the flexible display panel having defects due to laser irradiation is repaired. The defect repairing method of the flexible display panel can quickly and easily repair the defects caused by the laser irradiation of the flexible display panel so as to optimize the display effect of the flexible display panel and improve the yield of the flexible display panel.

BRIEF DESCRIPTION OF THE DRAWINGS

To describe the technical solutions in the embodiments of the present disclosure or in the prior art more clearly, the following briefly introduces the accompanying drawings required for describing the embodiments or the prior art. Apparently, the accompanying drawings in the following description show merely some embodiments of the present disclosure, and a person of ordinary skill in the art may still derive other drawings from these accompanying drawings without creative efforts.

FIG. 2 to FIG. 4 are schematic flow charts of partial process steps of a defect repairing method of a flexible display panel according to an embodiment of the present disclosure.

FIG. 5 is a partial flow diagram of a defect repairing method of a flexible display panel according to an embodiment of the present disclosure.

DETAILED DESCRIPTION OF PREFERRED EMBODIMENTS

Figure 1:
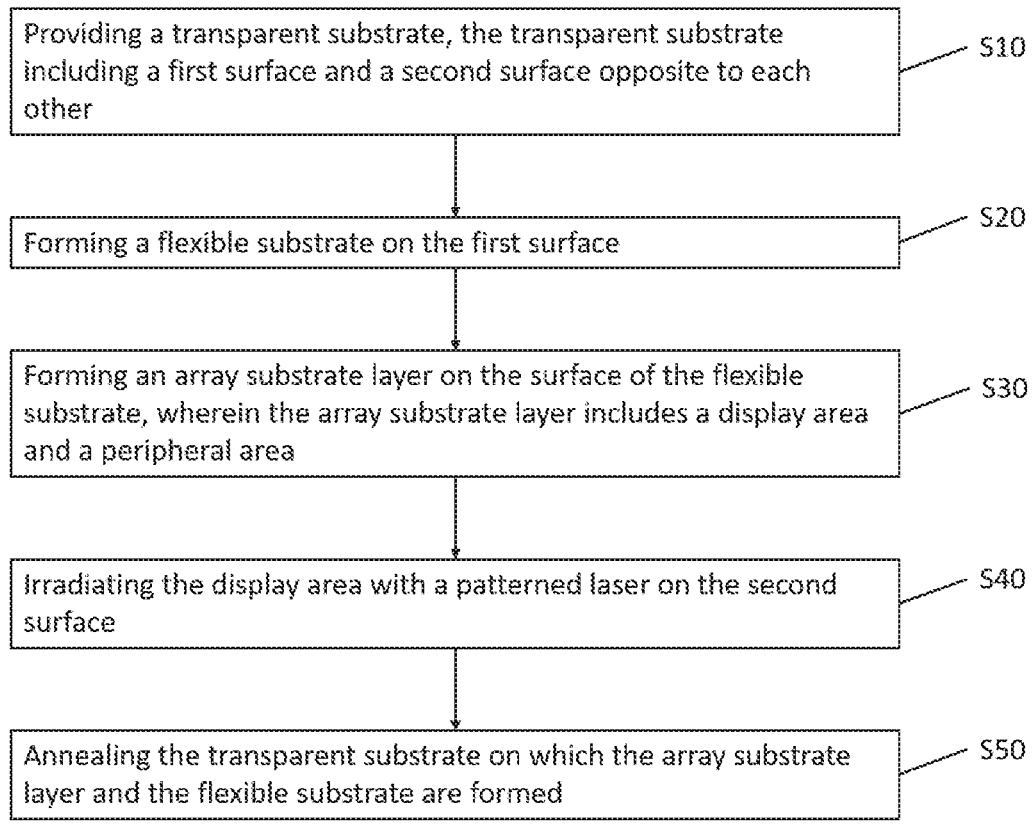
FIG. 1 is a flow chart of a defect repairing method of a flexible display panel according to an embodiment of the present disclosure.

Please refer to FIG. 1. FIG. 1 is a flow chart of a defect repairing method of a flexible display panel according to an embodiment of the present disclosure. The defect repairing method for a flexible display panel in the embodiments of the present disclosure is used for repairing a flexible display panel that is defective due to laser irradiation in separating the flexible display panel and the transparent substrate. The defect repairing method of the flexible display panel includes the following steps.

Step S10. Providing a transparent substrate 10, the transparent substrate 10 including a first surface 11 and a second surface 12 opposite to each other.

Figure 2:
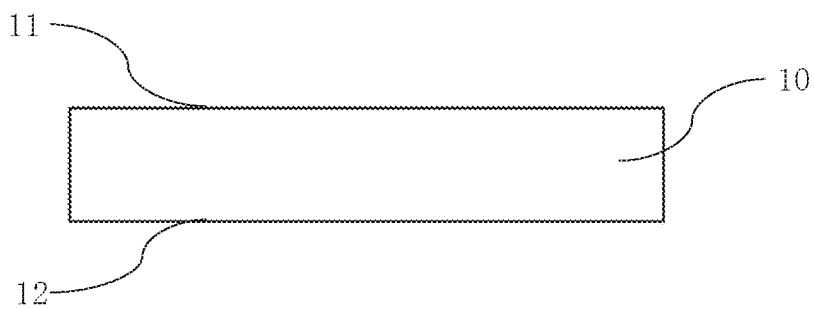

As shown in FIG. 2, the transparent substrate 10 includes a material substrate capable of transmitting light, such as a glass substrate. The first surface 11 and the second surface 12 disposed opposite to each other of the transparent substrate 10 keep the first surface 11 and the second surface 12 clean and evenly formed by cleaning or surface treatment. This is conducive to the subsequent uniform thickness of the flexible substrate 20 formed, and the surface is clean and smooth.

Step S20. Forming a flexible substrate 20 on the first surface 11.

As shown in FIG. 3, a layer of polymer solution is uniformly coated on the first surface 11 of the transparent substrate 10. In this embodiment, the polymer solution is a polyimide solution. In other embodiments, other polymer solutions, such as polyethylene or polyethylene terephthalate, may also be used. The polymer solution has a high temperature resistance. The polyimide solution coated on the first surface 11 of the transparent substrate 10 is placed in a high temperature oven for baking so that the polyimide solution is cured to form the flexible substrate 20. The coating method includes a spin coating method, a blade coating method, an inkjet printing method, or the like. The coating method can ensure that the flexible substrate is evenly and evenly adhered to the transparent substrate 10 and the thickness of the polyimide solution after curing can be controlled in real time.

Step S30. Forming an array substrate layer 30 on the surface of the flexible substrate 20, wherein the array substrate layer 30 includes a display area 31 and a peripheral area 32.

As shown in FIG. 4, after the first surface 11 of the transparent substrate 10 is coated with the flexible substrate 20 and cured, the array substrate layer 30 is formed on the surface of the flexible substrate 20 away from the transparent substrate 10. The array substrate layer 30 includes the display area 31 and the peripheral area 32. The display area 31 includes a barrier layer 311, a buffer layer 312 and a thin film transistor layer 313 that are sequentially stacked. The peripheral area 32 serves to fix the display area 31. The effective connection of the blocking layer 311, the buffer layer 312 and the thin film transistor layer 313 helps to improve the electrical characteristics of the array substrate layer 30 to optimize the display effect of the flexible display panel.

Step S40. Irradiating the display area 12 with a patterned laser on the second surface 31.

In this embodiment, the second surface 12 is irradiated with a patterned laser using an ultraviolet laser. UV laser wavelength range of 300 nm~350 nm. The process uses a wavelength of 308 nm UV lasers. The UV laser has a high energy. The ultraviolet laser emits laser. The laser passes through the first surface 11 of the transparent substrate 10 through the second surface 12 and irradiates the surface of the flexible substrate 20 adhered to the first surface 11. Since the flexible substrate 20 fails to adhere with the transparent substrate 10 due to the UV laser irradiation, the flexible substrate 20 and the transparent substrate 10 are separated. In other embodiments, the laser can also be used in other wavelength bands and can be designed according to the actual situation.

Specifically, in the step of irradiating the display area 12 with a patterned laser on the second surface 31, including providing a patterned mask and attaching it to the second surface 12, irradiating the mask with a UV laser. The flexible substrate 20 not shielded by the mask is separated from the transparent substrate 10, and the flexible substrate 20 shielded by the mask is adhered to the transparent substrate 10. Since the ultraviolet laser has a high energy, the ultraviolet laser can quickly and easily separate the transparent substrate 10 and the flexible substrate 20. In the present embodiment, the pattern of the mask makes the position on the transparent substrate not covered by the mask directly opposite to the display area 31, the position blocked by the mask plate directly opposite to the peripheral area 32. The surface of the mask has a plurality of identical rectangular holes. The mask is attached to the second surface 12 such that the projection of the array substrate 30 on the mask is located in the rectangular hole. The UV laser emits laser to irradiate the second surface 12. The laser of the UV laser passes through the rectangular hole of the mask and passes through the transparent substrate 10 to irradiate the flexible substrate 20. The flexible substrate 20, which is not blocked by the mask, is separated from the transparent substrate 10 by ultraviolet laser irradiation. The flexible substrate 20 and the transparent substrate 10, which are shielded by the mask, are adhered to each other. In this way, the flexible substrate 20 that is not irradiated with the laser is adhered to the transparent substrate 10 through the patterned laser irradiation, the flexible substrate 10 is prevented from falling off in a subsequent process and the flexible display panel can not be prepared. The flexible substrate 20 irradiated by the laser is separated from the transparent substrate 10, which facilitates the easy removal of the flexible substrate 10 that has been separated in a subsequent process.

In step S50, the transparent substrate 10 on which the array substrate layer 30 and the flexible substrate 20 are formed is annealed.

Figure 7:
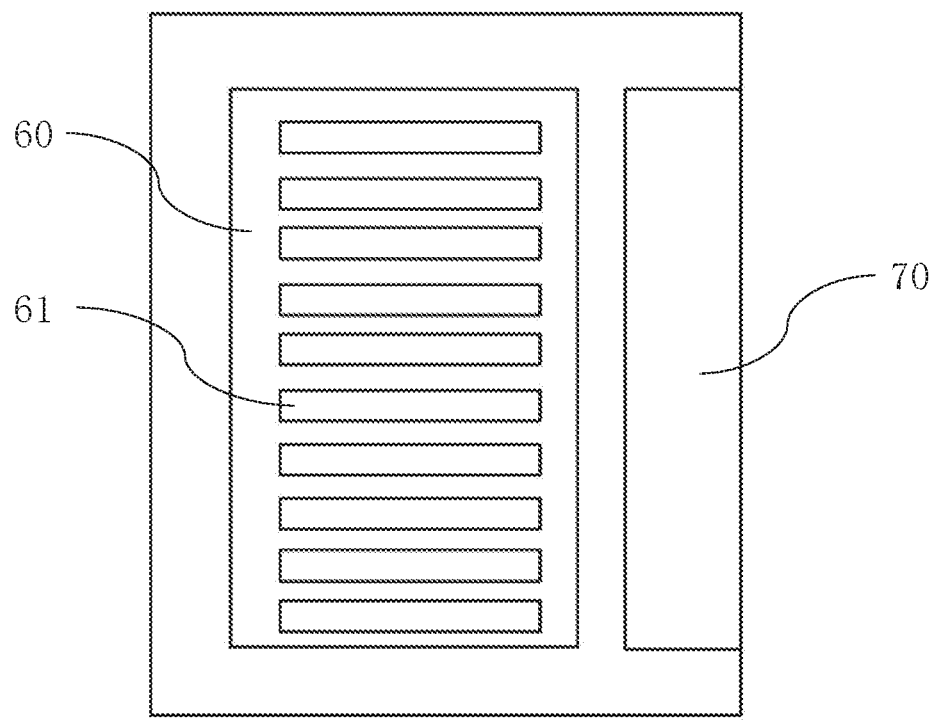
FIG. 7 is a schematic structural diagram of an annealing device according to an embodiment of the present disclosure.

As shown in FIG. 7, the annealing device includes a baking cavity 60 and a heater 70 on the side of the baking cavity 60. The baking cavity 60 is used to heat the transparent substrate 10 forming the array substrate layer 30 and the flexible substrate 20. The heater 70 is used to provide a heat source for heating. Specifically, the heater 70 can realize automatic heating. When the heater 70 starts to heat, the internal temperature in the baking cavity 60 also rises and reaches the preset temperature, and the flexible substrate 20 is annealed at the preset temperature and the preset constant temperature. In this embodiment, the flexible substrate 20 is annealed. In other embodiments, the flexible substrate 20 can be flexibly set according to actual situations by using other heat treatment methods, for example, normalizing or tempering. As the patterned laser irradiates the display area 31 on the second surface 12, the irradiated flexible substrate 20 is separated from the transparent substrate 10, resulting in various defects of the array substrate layer 30. For example, the thermal expansion coefficients of the barrier layers 311, the buffer layers 312 and the thin film transistor layers 313 are different, so that the barrier layers 311, the buffer layers 312 and the thin film transistor layers 313 are damaged by stress due to stress mismatch. This has an influence on the electrical characteristics of the array substrate layer 30, thereby significantly affecting the display effect of the flexible display panel. By placing the flexible substrate 20 in the annealing device for heat treatment, the stress between the barrier layer 311, the buffer layer 312 and the thin film transistor layer 313 in the array substrate layer 30 can be canceled, so that defects of the flexible display panel can be effectively solved. In other embodiments, defects such as radiation damage or thermal shock generated by the array substrate layer 30 may also be repaired by the retreat.

In this embodiment, a plurality of drawable brackets 61 are disposed inside the baking cavity 60, and the brackets 61 are arranged at equal intervals from each other. The bracket 61 is provided with four rollers. In other embodiments, the number of the rollers is not limited. The baking cavity 60 is provided with a slide rail for providing a roller for rolling. The brackets 61 are rolled on the slide rails by rollers, so as to enable the brackets 61 to be opened and closed. The bracket 61 is pulled, the bracket 61 can be moved out of the baking cavity 60 by the rollers, and the transparent substrate 10 is extracted by the robot to place the transparent substrate 10 on the bracket 61 in the baking cavity 60. The bracket 61 is made of a smooth stainless steel material to prevent the bracket from scratching or contaminating the second surface 12 of the transparent substrate 10. The bracket 61 may also be made of electro-galvanized steel or hot-dip galvanized steel.

In this embodiment, an annealing device is provided, the transparent substrate 10 forming the array substrate layer 30 and the flexible substrate 20 is placed in the annealing device. The step of annealing the transparent substrate 10 includes: presetting a preset temperature and a preset constant temperature time for the annealing device; activating the annealing device to heat, the annealing device reaches the preset temperature, and the transparent substrate is annealed at the preset temperature and the preset constant temperature. Specifically, the annealing device includes a controller, which is configured to control turning on and off of the annealing device and store a preset temperature and a preset constant temperature time.

Figure 6:
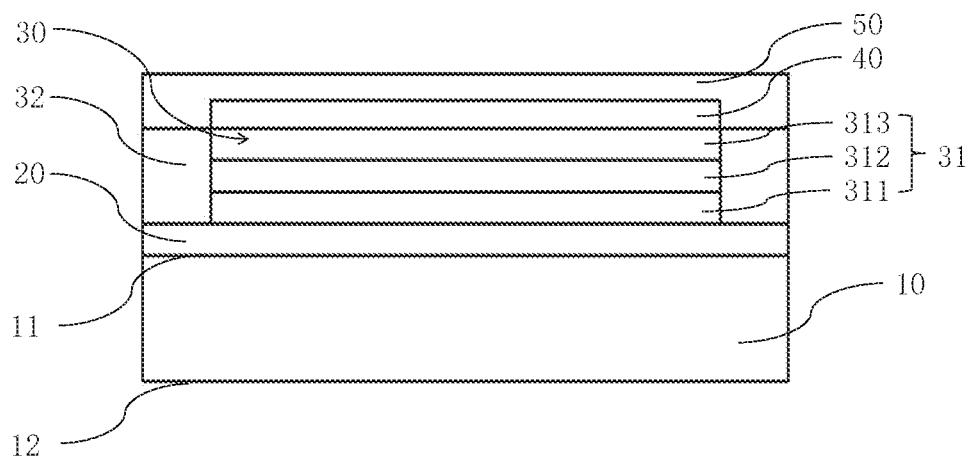
FIG. 6 is a schematic structural diagram of a flexible display panel according to an embodiment of the present disclosure.

As shown in FIG. 5 and FIG. 6, after the step of annealing the flexible substrate 20, the method further includes the following steps.

Step S60. Sequentially forming the organic light-emitting layer 40 and the encapsulation layer 50 on the surface of the array substrate layer 30 to form a flexible display panel.

The display of the flexible display panel is achieved by forming the organic light-emitting layer 40 on the surface of the array substrate layer 30 and matching the array substrate layer 30. An encapsulation layer 50 is formed on the surface of the organic light-emitting layer 40 and covers the organic light-emitting layer 40. The encapsulation layer 50 is used to protect the flexible display panel from the external environment such as water vapor, oxygen and dust.

Step S70. Separating the transparent substrate 10 and the flexible substrate 20 located in the peripheral area 32.

In the first embodiment of the present embodiment, in the step of separating the transparent substrate 10 and the flexible substrate 20, the glass substrate 10 and the flexible substrate 20 are separated by a cutting method. Specifically, after the flexible display panel finishes the encapsulation layer 50, the flexible display panel needs to be separated from the glass substrate 10. In the step of irradiating the display area 31 with patterned laser light on the second surface 12, the non-irradiated flexible substrate 20 and the transparent substrate 10 are adhered to each other. In order to effectively separate the flexible display panel and the transparent substrate 10, the present embodiment uses a cutting method to cut the separated portion between the flexible substrate and the transparent substrate. The display area 31 is cut out from the glass substrate 10 by cutting along the peripheral area 32 of the array substrate layer 30 with a cutter. In this way, cutting the display area 31 by the cutting method can not only quickly and completely separate the flexible display panel and the glass substrate 10, but also avoid damaging the array substrate layer 30 and the organic light-emitting layer 40 during the dicing process, thereby significantly improving the display quality of the flexible display panel.

In the second embodiment of the present embodiment, in the step of separating the transparent substrate 10 and the flexible substrate 20, the glass substrate 10 and the flexible substrate 20 are separated by a laser separation technique. Specifically, after the flexible display panel finishes the encapsulation layer 50, the flexible display panel needs to be separated from the glass substrate 10. In the step of irradiating the display area 31 with patterned laser on the second surface 12, the non-irradiated flexible substrate 20 and the transparent substrate 10 are adhered to each other. In order to effectively separate the flexible substrate 20 from the glass substrate 10, the second surface 12 is patterned with a UV laser for the second time. Specifically, a mask having a pattern is provided and attached to the second surface 12, and the mask is irradiated with a UV laser. The mask is used for shielding the display area 31 and the non-shielding peripheral area. The flexible substrate 20 that is not blocked by the mask plate is separated from the transparent substrate 10.

In this embodiment of the present disclosure, the array substrate layer 30 is formed on the surface of the flexible substrate 20 and the second surface 12 of the glass substrate 10 is patterned with a laser, so that the portion of the flexible substrate 20 that is irradiated with the laser light is separated from the transparent substrate 10. The portion of the flexible substrate 20 that is not irradiated with the laser is closely attached to the transparent substrate 10. The flexible substrate 20 is heat-treated by an annealing device so that the array substrate layer 30 having the defects on the flexible substrate 20 is repaired. The defect repairing method of the flexible display panel can quickly and easily repair the defects caused by the laser display of the flexible display panel so as to optimize the display effect of the flexible display panel and improve the yield of the flexible display panel.

The above disclosure is only the preferred embodiments of the present disclosure, and certainly can not be used to limit the scope of the present disclosure. People of ordinary skill in the art may understand that all or part of the procedures for implementing the foregoing embodiments and equivalent changes made according to the claims of the present disclosure still fall within the scope of the present disclosure.

What is claimed is:

1. A defect repairing method of a flexible display panel, comprising:
    providing a transparent substrate, the transparent substrate comprising a first surface and a second surface opposite to each other;
    forming a flexible substrate on the first surface;
    forming an array substrate layer on a surface of the flexible substrate, wherein the array substrate layer comprises a display area and a peripheral area;
    irradiating the display area with a patterned laser on the second surface; and
    annealing the transparent substrate on which the array substrate layer and the flexible substrate are formed,
    wherein the step of irradiating the display area with a patterned laser on the second surface comprises, providing a mask having a pattern and attaching the mask to the second surface and irradiating the mask by an ultraviolet laser; separating the flexible substrate not blocked by the mask from the transparent substrate, and adhering the flexible substrate covered by the mask and the transparent substrate to each other, and
    wherein the pattern of the mask makes a position on the transparent substrate not obscured by the mask directly opposite to the display area, the position blocked by the mask is directly opposite to the peripheral area.

2. The defect repairing method of a flexible display panel according to claim 1, wherein the step of annealing the transparent substrate on which the array substrate layer and the flexible substrate are formed comprises, providing an annealing device, placing the flexible substrate in the annealing device, presetting a preset temperature and a preset constant temperature time; starting the annealing device to be heated, the annealing device reaching the preset temperature, and annealing the transparent substrate on which the array substrate layer and the flexible substrate are formed at the preset temperature and the preset constant temperature time.

3. The defect repairing method of a flexible display panel according to claim 1, wherein after the step of annealing the flexible substrate, further comprising:
    forming an organic light-emitting layer and an encapsulating layer sequentially on a surface of the array substrate layer to form a flexible display panel;
    separating the transparent substrate located in the peripheral area and the flexible substrate.

4. The defect repairing method of a flexible display panel according to claim 3, wherein in the step of separating the transparent substrate and the flexible substrate, a glass substrate and the flexible substrate are separated by a cutting method.

5. The defect repairing method of a flexible display panel according to claim 3, wherein in the step of separating the transparent substrate and the flexible substrate, a glass substrate and the flexible substrate are separated by a laser separation technique.

6. The defect repairing method of a flexible display panel according to claim 1, wherein the step of forming a flexible substrate on the first surface and forming an array substrate layer on a surface of the flexible substrate comprises uniformly coating a polymer solution on the first surface to form the flexible substrate.

7. The defect repairing method of a flexible display panel according to claim 2, wherein the annealing device comprises a baking cavity and a heater located at one side of the baking cavity, the baking cavity is configured to heat the transparent substrate forming the array substrate layer and the flexible substrate, and the heater is configured to provide a heat source for heating.

8. The defect repairing method of a flexible display panel according to claim 7, wherein the baking cavity is provided with a plurality of drawable brackets, and the brackets are arranged at equal distances from each other.

* * * * *